(12) United States Patent
Serrer

(10) Patent No.: US 7,921,344 B2
(45) Date of Patent: Apr. 5, 2011

(54) MULTI-STAGE DATA PROCESSOR WITH SIGNAL REPEATER

(75) Inventor: Juergen Serrer, Holzgerlingen (DE)

(73) Assignee: Verigy (Singapore Pte. Ltd., Singapore (SG)

( * ) Notice: Subject to any disclaimer, the term of this patent is extended or adjusted under 35 U.S.C. 154(b) by 333 days.

(21) Appl. No.: 12/084,834

(22) PCT Filed: Feb. 7, 2006

(86) PCT No.: PCT/EP2006/050727
§ 371 (c)(1),
(2), (4) Date: May 9, 2008

(87) PCT Pub. No.: WO2007/090462
PCT Pub. Date: Aug. 16, 2007

(65) Prior Publication Data
US 2009/0282302 A1    Nov. 12, 2009

(51) Int. Cl.
*G01R 31/28*        (2006.01)
(52) U.S. Cl. .................................. 714/724; 714/738
(58) Field of Classification Search .................. 714/718, 714/724, 726, 727, 754, 738, 100, 5, 10, 714/30, 23, 38, 39, 31; 702/108, 118, 120, 702/121, 127, 189; 324/76.11, 500, 527, 324/555, 755, 763, 765
See application file for complete search history.

(56) References Cited

U.S. PATENT DOCUMENTS

| | | | | |
|---|---|---|---|---|
| 6,028,439 A | * | 2/2000 | Arkin et al. | 324/765 |
| 7,743,304 B2 | * | 6/2010 | Volkerink et al. | 714/738 |

FOREIGN PATENT DOCUMENTS
WO    WO 99/23499    5/1999

OTHER PUBLICATIONS

Rochit Rajsuman, "*An Overview of the Open Architecture Test System*", Second IEEE International Workshop on Electronic Design, Test and Applications, Feb. 2004, pp. 1-6.
International Search Report dated Oct. 31, 2006 from PCT/EP2006/050727.

\* cited by examiner

*Primary Examiner* — Phung M Chung
(74) *Attorney, Agent, or Firm* — Holland & Hart, LLP

(57)            ABSTRACT

A signal processing device having a plurality of processing stages, each of the plurality of processing stages being adapted for applying an input signal to each of at least one item under examination to be coupled to a respective one of the plurality of processing stages, and at least one signal reconditioning unit, each of the at least one signal reconditioning unit being adapted for reconditioning the input signal in a signal path between a preceding one of the plurality of processing stages and a subsequent one of the plurality of processing stages.

24 Claims, 4 Drawing Sheets

MULTI-STAGE DATA PROCESSOR WITH SIGNAL REPEATER

TECHNICAL FIELD

The present invention relates to a multi-stage data processor.

BACKGROUND

For testing electronic devices, in particular integrated electronic circuits providing digital electrical output signals, a test or stimulus signal is fed to an input of the device under test, and a response signal of the device under test is evaluated by an automatic test equipment, for example by comparison with expected data. Such an automatic test equipment has included a particular test functionality, that it to say test functions or routines which the test equipment may carry out. This test functionality may be incorporated in the test equipment in the form of executable software code.

Such a test device may be adapted as multi-stage data processor including a plurality of test stages connected to a central control unit in a Daisy chain manner, wherein each of the test stages may be coupled to a plurality of assigned devices under test. By taking this measure, it may be possible to simultaneously test a plurality of devices under test, for instance 256 devices under test using 64 test stages.

In such a scenario, a huge amount of test signals applied via individual test lines provided separately for each test stage are foreseen which, with the increasing demand for testing a plurality of devices under test simultaneously, may yield a large amount of hardware and software effort.

Thus, a plurality of stimulus signals are applied individually and separately to each of the processing stages so as to provide each processing stage with a number of correspondingly assigned stimulus signals.

SUMMARY

According to an embodiment, a signal processing device may have: a plurality of processing stages), each of the plurality of processing stages being adapted for applying a test signal to each of at least one item under examination to be coupled to a respective one of the plurality of processing stages; a signal reconditioning unit adapted for reconditioning an input signal; wherein at least one of the plurality of processing stages has an input connectable to an input signal generation unit for receiving an input signal therefrom and wherein the processing stage is adapted for supplying the input signal to the signal reconditioning unit, and wherein an input of a subsequent processing stage is connected to the signal reconditioning unit for receiving the reconditioned input signal therefrom.

According to another embodiment, a measurement apparatus may have: an input signal generation unit adapted for generating an input signal related to a measurement carried out by the measurement apparatus; a signal processing device of claim 1 for processing the generated input signal and for generating an output signal indicative of a result of the measurement carried out based on the input signal, the signal processing device having a plurality of processing stages, each of the plurality of processing stages being adapted for applying a test signal to each of at least one item under examination to be coupled to a respective one of the plurality of processing stages; a signal reconditioning unit adapted for reconditioning an input signal; wherein at least one of the plurality of processing stages has an input connectable to an input signal generation unit for receiving an input signal therefrom and wherein the processing stage is adapted for supplying the input signal to the signal reconditioning unit, and wherein an input of a subsequent processing stage is connected to the signal reconditioning unit for receiving the reconditioned input signal therefrom.

According to an exemplary embodiment of the present invention, a signal processing device is provided comprising a plurality of processing stages, each of the plurality of processing stages being adapted for applying an input signal to each of at least one item under examination to be coupled to a respective one of the plurality of processing stages, and at least one signal reconditioning unit, each of the at least one signal reconditioning unit being adapted for reconditioning the input signal in a signal path between a preceding one of the plurality of processing stages and a subsequent one of the plurality of processing stages.

According to another exemplary embodiment, a measurement apparatus is provided, the measurement apparatus comprising an input signal generation unit adapted for generating an input signal related to a measurement carried out by the measurement apparatus and a signal processing device having the above mentioned features for processing the generated input signal and for generating an output signal indicative of a result of the measurement carried out based on the input signal.

According to still another exemplary embodiment, a signal processing method is provided, the method comprising applying an input signal to each of at least one item under examination to be coupled to a respective one of a plurality of processing stages, and reconditioning the input signal in a signal path between a preceding one of the plurality of processing stages and a subsequent one of the plurality of processing stages.

According to yet another exemplary embodiment, a computer-readable medium is provided, in which a computer program of signal processing is stored, which computer program, when being executed by a processor, is adapted to control or carry out the above-mentioned method.

According to a further exemplary embodiment, a program element of signal processing is provided, which program element, when being executed by a processor, is adapted to control or carry out the above-mentioned method.

Embodiments of the invention can be partly or entirely embodied or supported by one or more suitable software programs, which can be stored on or otherwise provided by any kind of data carrier, and which might be executed in or by any suitable data processing unit. Software programs or routines can be applied for signal processing. The signal refreshing architecture according to an embodiment of the invention can be performed by a computer program, i.e. by software, or by using one or more special electronic optimization circuits, i.e. in hardware, or in hybrid form, i.e. by means of software components and hardware components.

According to an exemplary embodiment, in such a multi-stage processor, particularly for testing devices under test, input or stimulus signals may be provided in common for a part or for all processing stages. In other words, such input or stimulus signals are supplied to a stage in which this signal may be distributed among the coupled devices under test. After having supplied the devices under test of this stage with the input signals, the input signal may be refreshed by a signal reconditioning unit like a repeater unit, and may be supplied to the next processing stage, and so on.

By such a signal distribution architecture—which may be similar to a Daisy chain structure—and which may be denoted as a signal reconditioning fan out architecture, the number of connection pins and transmission lines for providing devices under test with stimulus signals may be significantly reduced. Denoting a number of drive data input signals by N and denoting a number of expected/mask data signals by M, only N+M common input signals have to be supplied to such a system and may be distributed evenly among the DUTs in each of the processing stages. In case of a number P of processing stages, this may reduce the number of connection pins and transmission lines from conventionally (N+M)×P to essentially N+M.

This may allow for a significant reduction in complexity of hardware and/or software components. Therefore, such a Daisy chain and/or fan out architecture may reduce costs and dimensions as well as testing time.

The reconditioning units (for example signal repeaters or refreshing units) may have the capability to bring back a damped input signal (for instance damped due to ohmic losses) to its original amplitude level, to remove signal distortions (for instance caused by influences acting on the signal during transmission) by smoothing the input signal, and/or by performing other measures for recovering or restoring an input signal to have properties being as close as possible to original input signal properties.

Such an architecture can be advantageously applied in a test device for testing a device under test, for instance for testing semiconductor products, particularly integrated circuits, more particularly storage device products like DRAMs. For testing such devices, a plurality of test sequences may be applied to the DRAM products and response signals of the DRAM products as devices under test are evaluated. As a result of the application of such test signals, the devices under test may return one or a plurality of pass/fail signals indicative of the function and thus of the quality of the device under test.

According to an exemplary embodiment, such a plurality of response signals may be pre-processed within each of the processor stages before being returned to the central control unit. In such a context, a single pass/fail signal may be generated for each DUT within a processor stage based on the plurality of pass/fail signals, the single pass/fail signal carrying the information whether this DUT has passed or failed the test.

Furthermore, timing signals may be applied to the individual processing stages of such a test apparatus. According to an exemplary embodiment of the invention, such timing signals may be supplied individually for each of the processor stages, and may be fanned out to the individual devices under test assigned to a particular processing stage. Such timing signals may be generated locally, i.e. on the IC (on-chip).

Such an architecture may allow to perform an economical test of a device under test and may be capable of testing large amounts of devices under test with low costs.

Examples for tests to be performed with such electronic products are so-called DC tests in which a supply voltage VDD provided by such an integrated circuit may be tested. With an I/O test, it is possible to test I/O pins by applying signals, particular alternating current signals. A core test may allow to test each or a part of, for instance, 500 millions of field effect transistors (MOSFET) of a memory device. In this context, information may be written in, read out and rewritten in individual or groups of memory devices according to predetermined schemes or test routines.

When such a plurality of test items are tested during carrying out a complex test routine, it may be appropriate to implement a partitioning architecture so as to split test resources between different portions of a test system. When different units of such a test apparatus provide different (for instance complementary) contributions to the entire test functionality, then two or more of such units may be combined advantageously. For instance, a first part of the test may be carried out by a first measurement unit and a second part of the test may be carried out by a second measurement unit. When the functionality or test resources of the measurement units are divided between the measurement units, each of the measurement units can be manufactured with relatively low costs, and the measurement units can be operated in combination so as to keep test time and test cost reasonably small.

Thus, the test functionality may be split between several test units. Such an architecture may also allow for an increase of the degree of parallelity, so that the throughput and the productivity of an entire test system may be increased. By dividing the functionality of such a "dual insertion" system for providing a test carried out at-speed (not only at low speed), the performance of the test system may be improved. "At-speed" may particularly denote that a memory test is performed with such a velocity which essentially equals to a velocity in which the memory device shall be operated during normal use.

Exemplary embodiments of the invention may be implemented on a test device having a structure similar like, for instance, the 93000 test device of Agilent Technologies. With the explained improvements of such a test apparatus, it may be possible to test simultaneously 256 or even 512 devices under test ("sites").

With a "Daisy chain" signal supply scheme, input signals provided by a central control unit to a first processor stage may be fanned out within this processor stage to all coupled devices under test (for instance four). After having refreshed these input signals, the refreshed input signals may be supplied to a second processor stage, and so on. For an architecture of 64 processor stages connected according to a Daisy chain architecture, each processor stage being capable of testing four DUTs, it becomes possible to test 256 sides at least partially parallel. Such a test routine may comprise the steps of "sampling" (DUTs of one stage)—refreshing (the input signal using a repeater)—"forwarding" (that is supplying the stimulus signals to the next stage).

According to an exemplary embodiment of the invention, test signals and compare signals are supplied from an IC test control unit via, for instance, 40 pins to a first processor stage which then fans out these signals to the connected, for instance, four DUTs. The signals are further guided through a repeater before being injected into a second test stage where the same test and comparison signals are again fanned out to the connected DUTs. This may be repeated, for instance 64 times. Therefore, the provision of N+M signals instead of (N+M)×64×4 signals is sufficient, which results from the Daisy chain and fan out architecture.

According to another exemplary embodiment, a number of Q pass/fail signals provided at an output of each DUT in response to the application of stimulus signals to the DUT may be pre-processed in each processor stage so that a single pass/fail signal may be sent back to the central control instance. This single pass/fail signal may include the information whether the DUT has passed the test (for instance logical value "1") or has failed the test (for instance logical value "0"). With such an architecture, the number of overall response signals may be reduced to the number of DUTs.

According to still another exemplary embodiment, timing references (denoted as L1, L2, . . . , LP in FIG. 1) which may be provided individually for each of the processor stages may be supplied in common for all DUTs of a processing stage. Namely, when a processor stage is supplied with individual timing signals or timing references, these may be fanned out by a processor stage to the assigned DUTs. This fan out architecture concerning the timing signals may reduce the timing signals by a factor which equals to the number of DUTs per processor stage. Such timing signals may include a clock signal, a strobe signal, etc.

Next, further exemplary embodiments of the invention will be described. In the following, further exemplary embodiments of the signal processing device will be explained. However, these embodiments also apply for the measurement apparatus, for the signal processing method, for the computer-readable medium and for the program element.

The plurality of processing stages may be coupled to one another in such a manner that the input signal is applyable to each of the plurality of processing stages as a common input signal. Such an architecture may serve to couple the stages in accordance with a Daisy chain.

The device may further comprise an input signal generation unit adapted for generating the input signal. Such an input signal generation unit may be part of a central control device for controlling the entire data processing system.

The input signal generation unit may be adapted for generating a single input signal or a plurality of input signals, typically 40. Such common input signals may include drive signals for stimulating an electronic device under test to generate output signals and may include compare signals to be compared to the output signals as a basis for a decision whether a deviation between (expected) compare signals and (actual) output signals is sufficiently small to accept the DUT or if the deviation is so large that the DUT has to be rejected.

The input signal generation unit may be coupled to the plurality of processing stages via at least one wire or transmission line carrying the input signal to be supplied to each of the plurality of processing stages. By taking this measure, the number of (wired or wireless) lines or wires needed for supplying the input signals to a plurality of processing stages may be reduced by a factor which equals the number of processing stages.

The input signal generation unit may be coupled to the plurality of processing stages in such a manner that a signal path between a first one of the plurality of processing stages and the input signal generation unit is free of a signal reconditioning unit. Thus, the input signals may be provided directly to the first processing stage without any intermediating instance therebetween.

However, the input signal generation unit may be adapted for generating the input signal as a stimulating signal for performing a test for testing the at least one item under examination coupled or to be coupled to at least one of the plurality of processing stages. Thus, the data processing device may be adapted as a test device, and the input signals may define a test sequence.

The device may comprise, for each of the plurality of processing stages, the at least one item under examination. Thus, a hierarchical structure may be provided having a (single) central control instance, a plurality of processing stages controlled by this central control instance and, for each of the processing stages, one or a plurality of items under examination. However, the input signal distribution architecture may deviate from such a pure hierarchical structure and may introduce a cross-coupling between different staged to make the input signal supply more efficient.

At least a part of the items under examination may be devices under test (DUT). Such a device under test may be a memory device, a logic device, an electric circuit, an integrated circuit, a processor, a system-on-chip, or a hybrid circuit. More generally, any electronic product may be tested by the data processing system according to an exemplary embodiment of the invention. However, the architecture of the invention is particularly advantageous for a memory test, more particularly for a DRAM test.

At least a part of the plurality of processing stages may be coupled to one another as a Daisy chain. This is an economical way of coupling the plurality of processing stages so as to reduce the amount of wires for supplying the stimulus or test signals.

At least a part of the at least one signal reconditioning units may be repeater units. Such a repeater unit may refresh the signal after having left one processing stage and before entering the next stage. Thus, it may be ensured also for processing stages arranged at a position close to the end of the Daisy chain with clear and meaningful signals so as to improve the reliability of the test. The term "repeater" may denote a communication equipment which receives weak incoming signals and amplifies and retransmits or "repeats" the received incoming signal so that signal reception can be accomplished at greater distances. Such a system might be used to improve centralized input signal distribution. In the context of exemplary embodiments of the invention, a repeater device may be used in channels to amplify or regenerate input signals.

At least a part of the plurality of processing stages may be adapted to receive, from each of the respectively assigned at least one item under examination, a plurality of response signals in response to the input signal applied to each of the respectively assigned at least one item under examination. Such a response signal may include the information that—at least a portion or section of—the device under test works properly (i.e. has passed the test) or does not work properly (i.e. has failed the test).

Particularly, each of the plurality of processing stages may be adapted to generate, based on the plurality of response signals of each of the respectively assigned at least one item under examination, a decreased number of response signals. Thus, before transmitting back the signals to the central control instance, the number of the output signals may be reduced to a smaller number of, for instance, one output signal. Such a reduced number of output signals may be meaningful to indicate whether a DUT has passed the test or not and may reduce the signal traffic. This may also reduce the number of wires or transmission paths needed for transmitting signals between a central control instance, the plurality of processing stages and the devices under test.

At least a part of the plurality of processing stages may be adapted to fan out the input signal to each of the respectively assigned at least one item under examination. One and the same bundle of signals may be supplied to each of the items under examination connected to an individual processing stage so as to further reduce the complexity of the testing system.

Furthermore, the device may comprise a timing signal generation unit adapted for generating a timing signal and adapted for supplying the timing signal to each of the plurality of processing stages for timing the signal processing of each of the plurality of processing stages. Such timing signals may synchronize the test routine and may include information like clock, strobe, etc.

At least a part of the plurality of processing stages may be adapted to fan out the timing signal to each of the respectively assigned at least one item under examination. Taking this measure may further reduce the number of wires included particularly for distributing timing signals within one processing stage to a plurality of assigned devices under test.

In the following, further exemplary embodiments of the measurement apparatus will be explained. However, these embodiments also apply for the signal processing device, the signal processing method, the program element and the computer-readable medium.

The measurement apparatus may comprise at least one of a test device for testing a device under test or a substance, a memory test device for testing a memory device under test, a device for chemical, biological and/or pharmaceutical analysis, a fluid separation system adapted for separating compounds of a fluid, a capillary electrophoresis device, a liquid chromatography device, a gas chromatography device, an electronic measurement device, and a mass spectroscopy device.

In particular, embodiments of the invention may be particularly applied to any analysis or test system including a hierarchic structure and including the need to distribute signals sufficiently.

The measurement apparatus may comprise a first measurement unit adapted for performing a first part of a measurement and may comprise a second measurement unit adapted for performing a second part of the measurement. At least a part of the capability of the first measurement unit may be not included in the capability of the second measurement unit and/or at least a part of the capability of the second measurement unit may be not included in the capability of the first measurement unit. Thus, the two parts of the measurement apparatuses may supplement or assist each other so as to provide—in combination—a necessary test functionality. This may reduce the efforts for constructing each of the measurement units to a minimum so as to enable to provide a cheap measurement apparatus.

BRIEF DESCRIPTION OF THE DRAWINGS

Other objects and many of the attendant advantages of embodiments of the present invention will be readily appreciated and become better understood by reference to the following more detailed description of embodiments in connection with the accompanied drawings. Features that are substantially or functionally equal or similar will be referred to by the same reference signs.

Embodiments of the present invention will be detailed subsequently referring to the appended drawings, in which.

Figure 1:
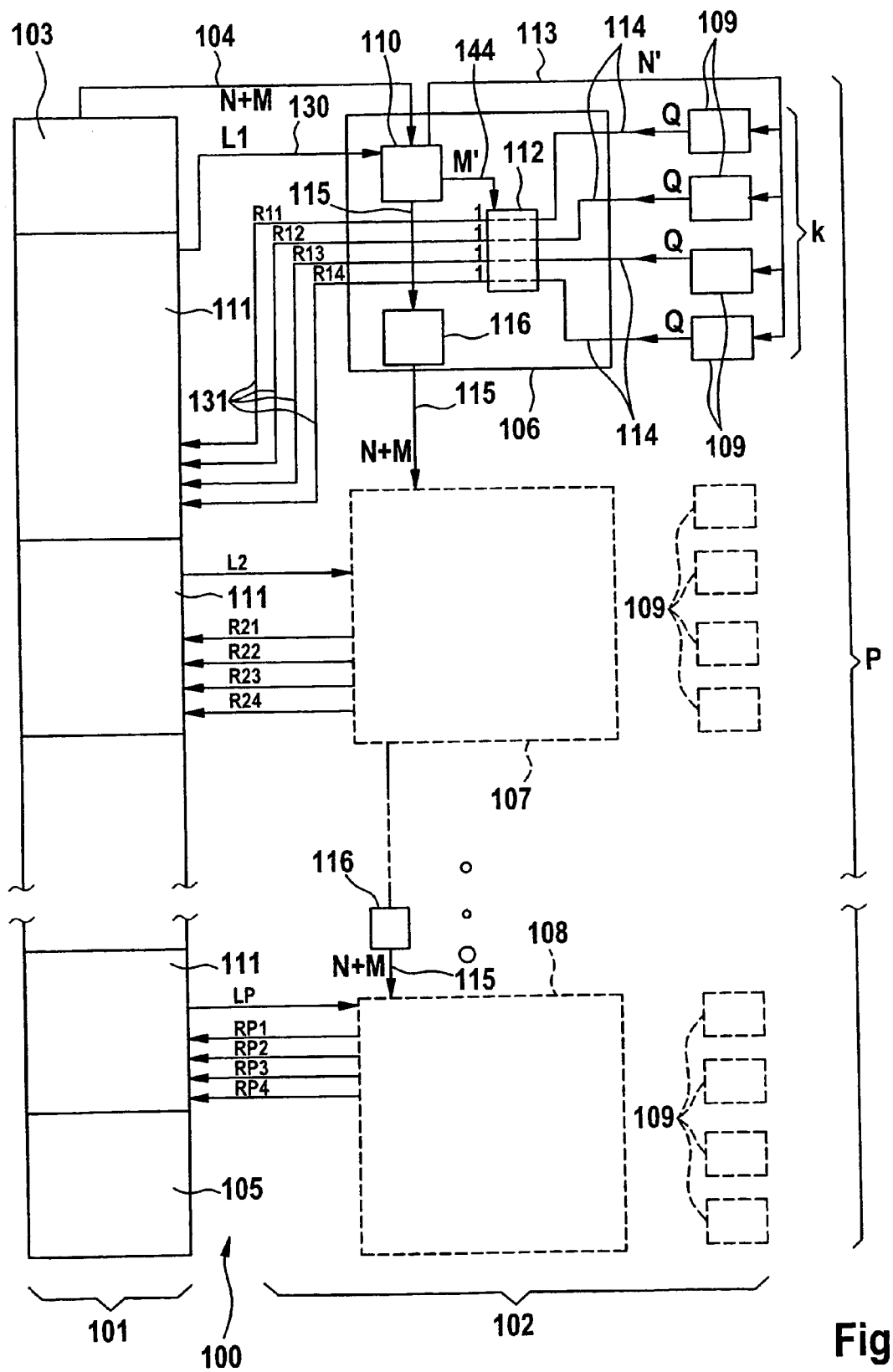
FIG. 1 shows a measurement apparatus comprising a signal processing device according to an exemplary embodiment of the invention.

The illustration in the drawing is schematically.

DETAILED DESCRIPTION

In the following, referring to FIG. 1, a measurement apparatus 100 according to an exemplary embodiment of the invention will be explained.

The measurement apparatus 100 comprises essentially two parts, namely a central control unit 101 and a data processing device 102.

The central control unit 101 includes an input signal generation unit 103 which is adapted for generating N+M input signals (namely N drive signals and M compare signals) related to a measurement carried out by the measurement apparatus 100. These input signals are supplied via an input signal supply line 104 to the signal processing device 102.

The signal processing device 102 is adapted to process the generated input signals transmitted via the input signal supply lines 104 and to generate output signals which may be supplied to a post processing unit 105 of the central control unit 101.

The signal processing device 102 is formed of a number of P stages, wherein P may be 64. A first stage 106 is shown in detail in FIG. 1. Further stages 107, . . . , 108 are shown in FIG. 1 but are not illustrated in detail for the sake of simplicity.

Each of the plurality of processing stages 106 to 108 is adapted for applying the input signals to connected devices under test 109. In the embodiment of FIG. 1, four devices under test 109 are coupled to each of the processing stages 106 to 108. More generally, the number of devices under test 109 may be denoted as K (K=4 in the embodiment of FIG. 1). Thus, K×P sites may be processed with the configuration of FIG. 1. According to an exemplary embodiment, P=64 and K=4, so that 256 sites may be tested with the configuration of FIG. 1. The devices under test 109 may be readily manufactured DRAM storage device products which have to be tested concerning the functionality before being brought to the market to be sold to customers.

As can be taken from FIG. 1, the processor stage 106 comprises a fan out unit 110 which receives as an input the N+M input signals generated by the input signal generation unit 103. Furthermore, a number of L1 timing signals or timing references are supplied via timing signal supply lines 130 from a timing signal generation unit 111 of the central control unit 101 to the fan out unit 110 of the processing stage 106.

The N+M+L1 signals which are stimulus and timing/synchronization signals for carrying out the test for testing the devices under test 109 are supplied in a fan out architecture to each of the devices under test 109. More particularly, the fan out unit 110 generates N' timed drive signals based on the N drive signals and the L1 timing references. Furthermore, the fan out unit 110 generates M' timed compare signals based on the M compare signals and the L1 timing references. The N' timed drive signals are supplied via lines 113 to the devices under test 109 and are processed there, and in response to the application of these signals, Q response signals are generated by each of the DUTs 109 and are transmitted to a response signal pre-processing unit 112. The response signal pre-processing unit 112 is assigned to the individual processing stage 106 and pre-processes the Q response signals by comparing the Q response signals to the M' timed compare signals provided to the pre-processing unit 112 via a line 144. In the Q signals, the information is encoded whether the functionality of the devices under test 109 is acceptable or not. This information may be encoded for different portions of the device under test 109 in each of the Q signals. The response signal pre-processing unit 112 generates a single response signal from each of the Q signals, wherein the individual single response signal R11, R12, R13, R14 for each device under test 109 indicates whether this particular device under test 109 has passed the test or not. This response signal is transmitted back to the timing signal generation unit 111 and may be further processed by the response signal post-processing unit 105 of the central control unit 101.

The N' test signals are supplied via test signal supply lines 113 to the devices under test 109. The Q response signal carrying lines are denoted as first response lines 114. The single response signal carrying lines are denoted as second response lines 131.

Coming back to the more general architecture of the system 100, after the N+M signals have been transmitted to the fan out unit 110, these signals are not only provided to the DUTs 109 of stage 106 via line 113, but also are supplied to an input signal forwarding line 115. This input signal forwarding line 115 is connected to a repeater 116 which reconditions, regenerates or refreshes the N+M input signals and transmits these N+M refreshed input signals to the next processing stage 107. Therefore, the processing stages 106 to 108 are interconnected as some kind of Daisy chain which may make it dispensable to supply N+M individual signals to each of the processing stages 106 to 108. In contrast to this, N+M common supply lines 104 are sufficient.

As can be taken from FIG. 1, each of the stages 106 to 108 has an assigned timing signal generation unit 111, providing stage-specific timing references L1, L2, . . . , LP. Correspondingly, response signals R11, R12, R13, R14, response signals R21, R22, R23, R24, . . . , response signals RP1, RP2, RP3, RP4 are transmitted back to the individual timing signal generation units 111.

Such an architecture may be implemented in a 93000 High Speed Memory (HSM) series apparatus of Agilent Technologies.

When testing electronic devices, particularly high speed memories, tests may be carried out like a continuity test, a memory core test (including a retention test, a long cycle test, various pattern types may be applied, the test may be carried out for 5-10 minutes and does not scale with the I/O speed), and a memory core access test may be applied (wherein various pattern types may be applied, the test may scale with I/O speed, which may typical be done on low speed depreciated testers, and a core may be accessed via test modes). Further tests to be carried out include a continuity test, a DC test, an I/O test (wherein I/O parameters like "logic vectors" may be carried out and the test may take approximately 6 seconds). A memory core access test may be performed, wherein various pattern types may be applied, speed binning, two to three minutes test time is possible, the tests may scale linearly with I/O speed, and there is a need to be done at speed. Typically this test may also be done on leading edge automatic test equipment (ATE).

In such a scenario, embodiments of the invention are related to the issue as to how the at-speed I/O and core access test can be done more economically. For this purpose, a separation of test content and a fan out option particularly for next generation DRAMs (for instance DDR3, DRAM according to Double Data Rate 3) may be performed.

Figure 2:
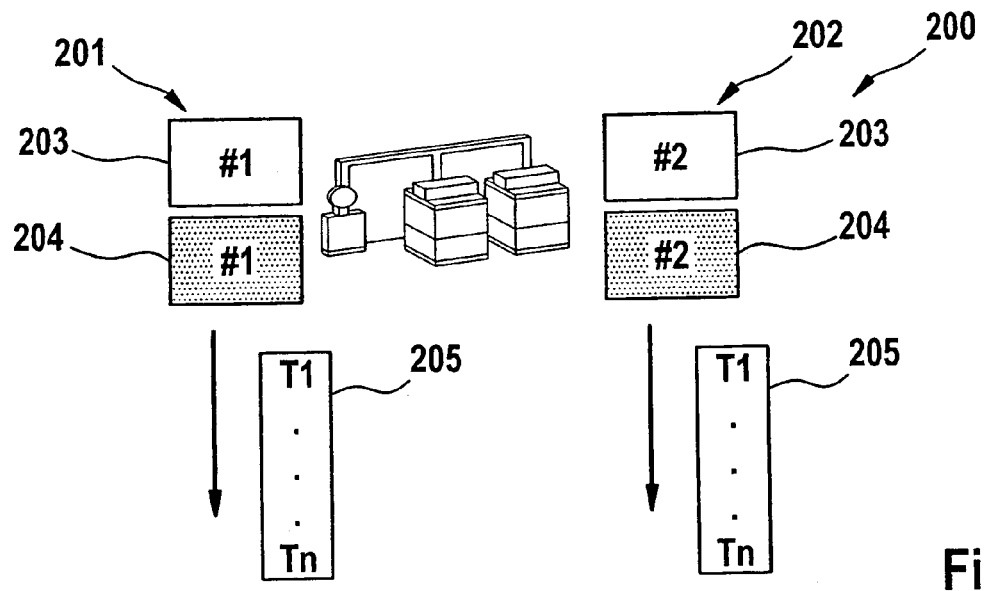
FIG. 2 shows two measurement units of a measurement apparatus.

FIG. 2 shows an approach of a test apparatus 200 in which a first test unit 201 and a second test unit 202 are provided. A testhead of each of the units 201, 202 is denoted with reference numeral 203 and a handler is denoted with reference numeral 204. As illustrated schematically in the form of rectangles 205, the test functionality items T1 to Tn are foreseen in each of the test units 201, 202, that is to say partly redundant. When a part of the test is carried out using the first test unit 201 and another part of the test is carried out using the second test unit 202, the redundancy of the test resources in the test units 201 and 202 is inefficient.

Figure 3:
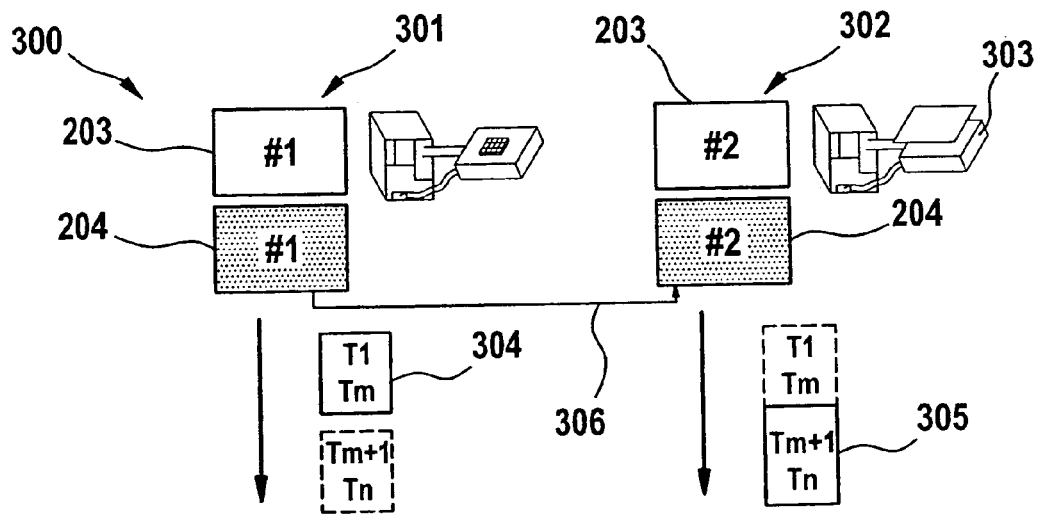
FIG. 3 shows two measurement units of a measurement apparatus according to an exemplary embodiment of the invention.

FIG. 3 shows a test apparatus 300 according to an exemplary embodiment of the invention comprising a first measurement unit 301 and a second measurement unit 302.

A fan out option 303 is indicated schematically in FIG. 3. Furthermore, FIG. 3 shows that the first test unit 301 has implemented only the test functionality 304 including the capability to perform test features T1 to Tm, but not test features Tm+1 to Tn. However, on the other hand, the second test unit 302 has implemented only the capability to perform test features Tm+1 to Tn, but not the test features T1 to Tm. This is indicated schematically in a rectangle 305.

In the embodiment shown in FIG. 3, a separate I/O and fan out core are provided, and a partitioning of the test content is made possible. By taking this measure, test resources may be used more efficiently.

Particularly, the first test unit 301 may have implemented the functionalities of a continuity test, a DC test, an I/O test (of for instance 6 seconds), a test of 16 sites (4.0 Gigabits/s), and a test of 16 sites (3.6 Gigabits/s). On the other hand, the second test unit 302 has implemented a continuity test, a memory core access test (2 minutes), 256 sites (4.0 Gigabits/s), and a handler. The entire costs for the measurement apparatus 300 may be smaller than for the measurement apparatus 200.

The test features T1 to Tm include a continuity test, DC tests, I/O tests, and a handler. The test features Tm+1 to Tn include a continuity test, memory core access tests, and a handler. The test features T1 to Tm do not include, inter alia, memory core access tests. The test features Tm+1 to Tn do not include, inter alia, I/O tests.

As indicated with reference numeral 306 in FIG. 3, an integrated automatic feed forward function may be implemented in the system 300. Thus, the block 204 of the first test unit 301 and the block 204 of the second test unit 302 may be provided as not strictly separated from one another. In contrast to this, they may be functionally coupled. In this context, the block 204 of the first test unit 301 may supply test results to the block 204 of the second test unit 302. Furthermore, the block 204 of the first test unit 301 may provide the block 204 of the second test unit 302 with device resources which may allow for automatic data logging and/or speed binning (for classifying the system 300 to belong to a particular speed class).

Figure 4:
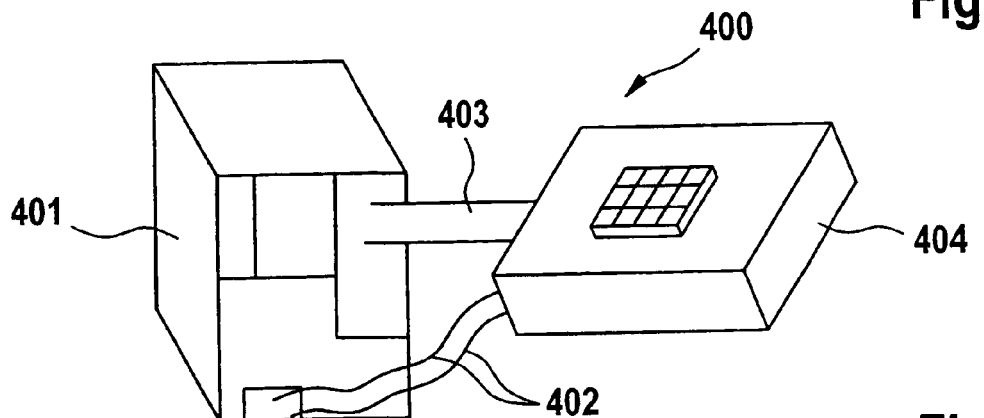
FIG. 4 shows an overview of a test apparatus according to an exemplary embodiment of the invention.

FIG. 4 shows schematically a test apparatus 400 according to an exemplary embodiment. of the invention which is similar to the 93000 HSM series of Agilent Technologies.

The system includes a HSM series system unit 401 which is connected via cables 402 and a support 403 to a testhead 404 filled with a HSM 2200 (that is test sequences) and DPS cards (that is a current supply). The architecture shown in FIG. 1 or FIG. 5 may be implemented in such a testhead 404. Particularly, a 16x site performance fixture may be provided in the testhead 404. An active fan out option is provided within the testhead 404.

Figure 5:
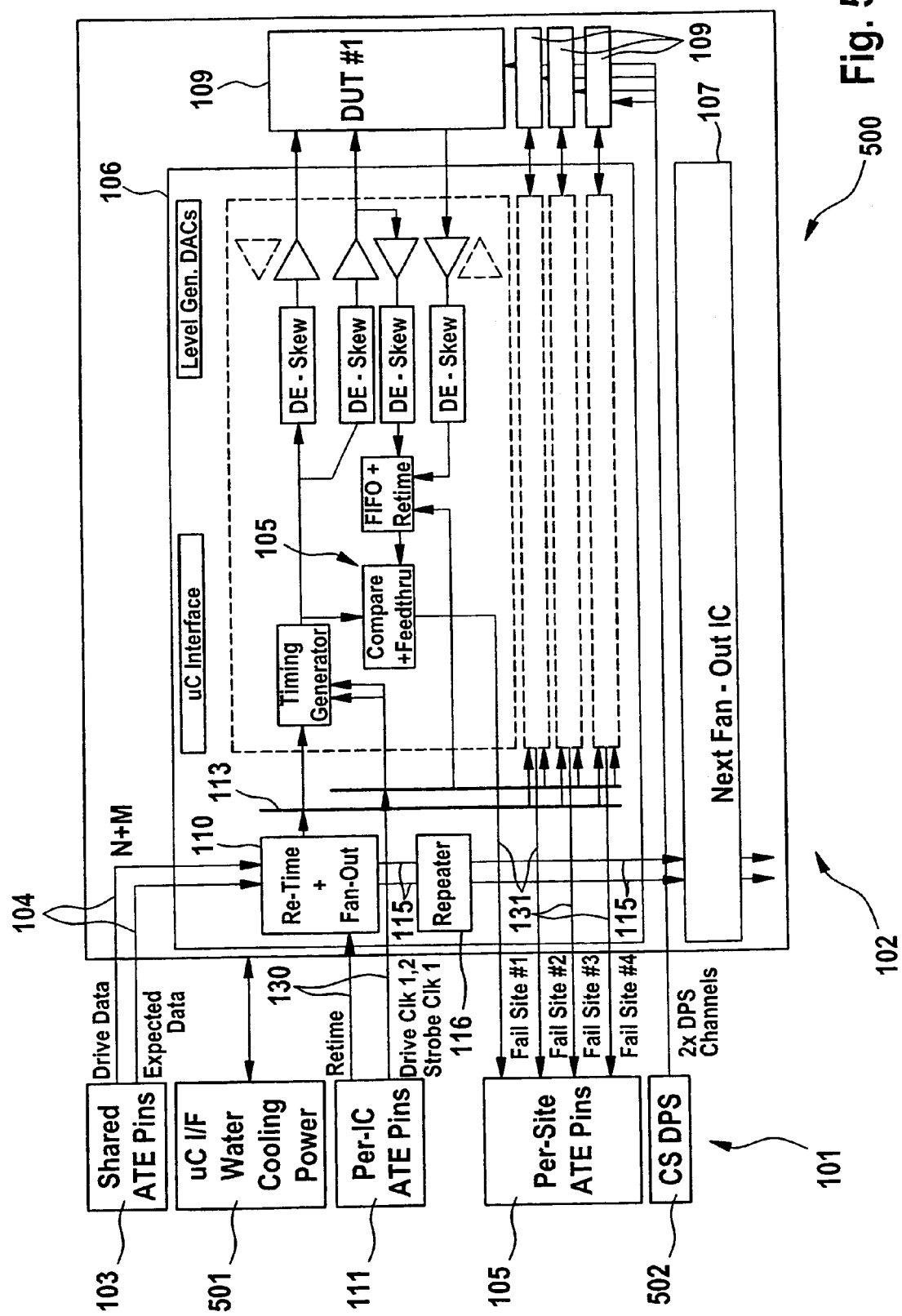
FIG. 5 shows details of the test apparatus of FIG. 4.

FIG. 5 shows a part of measurement apparatus 500 according to an exemplary embodiment of the invention.

The architecture of FIG. 5 is similar to that of FIG. 1. A first processing stage 106 is shown in detail and a second processing stage 107 is shown schematically. Furthermore, some portions of the central control instance 101 are shown in more detail. Furthermore, a water cooling and power supply unit 501 is shown as well as a DUT energy supply unit 502.

Figure 6:
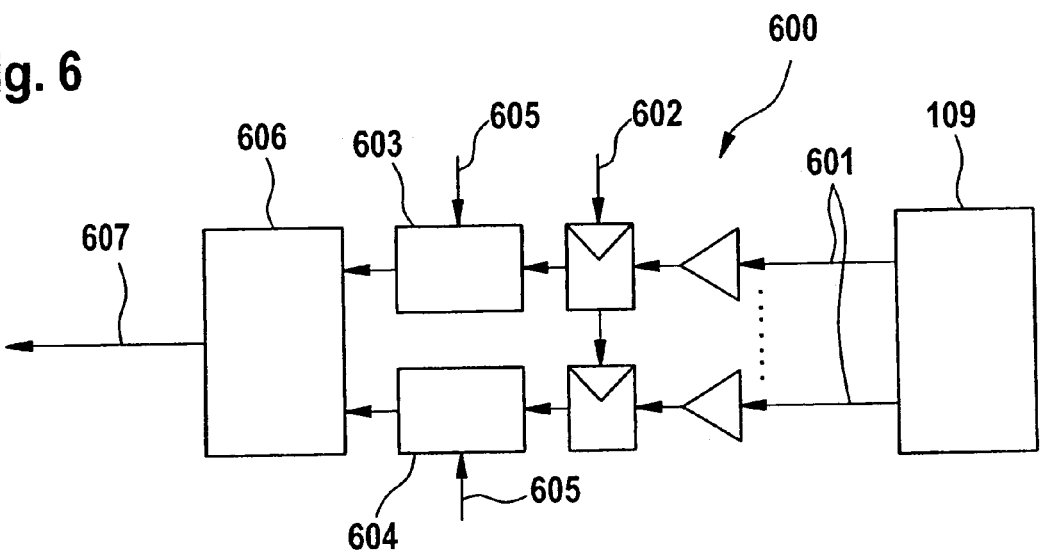
FIG. 6 shows a fail signal generation portion of a test apparatus according to an exemplary embodiment of the invention.

FIG. 6 illustrates a circuit diagram 600 will be explained to illustrate how the pass/fail signals of the individual DUTs 109 may be processed within a system as shown in FIG. 1 of FIG. 5.

Such a compare per-site architecture considers the need to capture failure information and the need to allow to switch in "engineering mode" for debugging tasks.

One aspect of such a system is that an ATE sends "expected data" to fan out ICs 106 to 108, using repeaters 116. Locally, a comparison per site is carried out. A single pin is used to report fail per site (and continuity test). This allows failed cycle/address capturing at-speed. This further allows masking on cycle basis. A single pin may be selected or the results may be combined.

Signals 601 coming from the DUT 109 are processed together with a strobe signal 602. In comparison units 603, 604, the corresponding DUT 109 signals 601 are compared with expected data 605. A logical unit 606 may select a pin or may process the input signals according to a logical or combination. An output signal 607 may be provided per site as a fail signal and may be supplied to an ATE pin.

Figure 7:
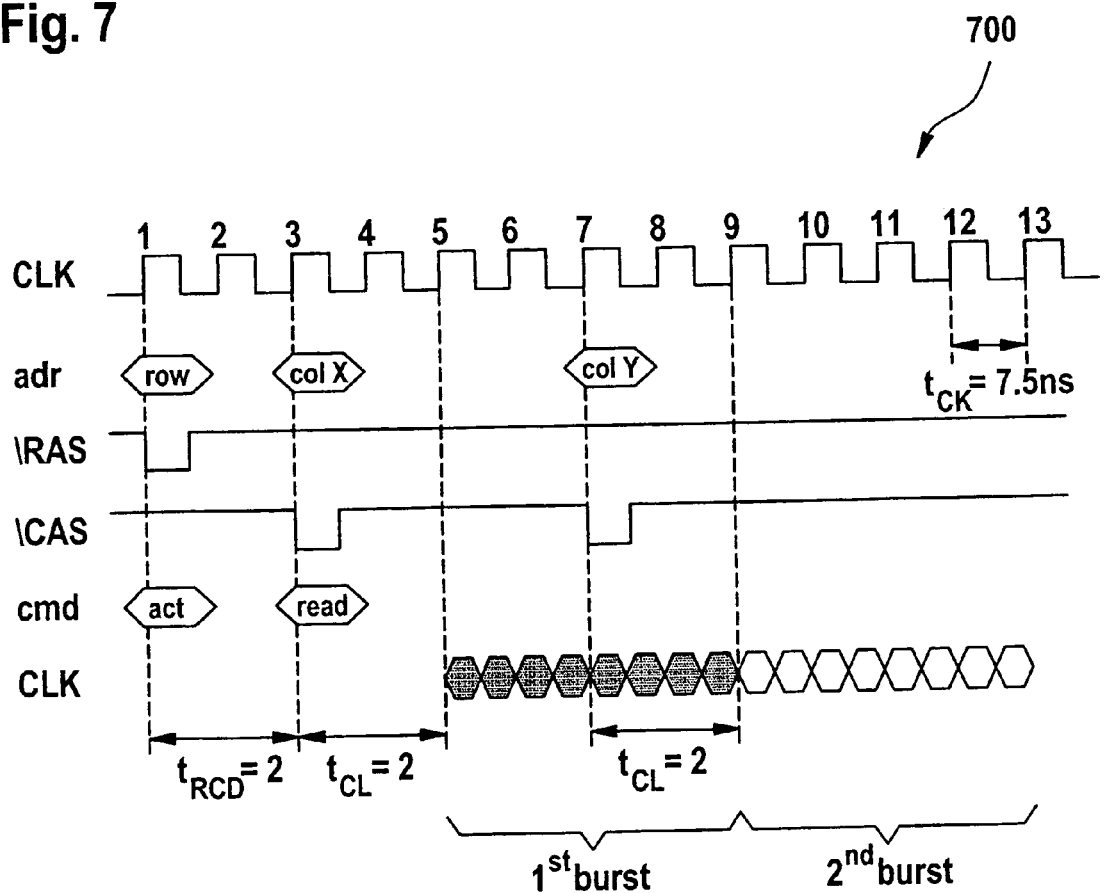
FIG. 7 shows timing signals of a test apparatus according to an exemplary embodiment of the invention.

FIG. 7 illustrates a timing diagram 700 showing details concerning the device timing.

A core test may necessitate a low-jitter clock for DUT's internal timing, save t_setup/hold timing for ensured latching, save strobing, and Fmax test, speed binning. The timing is generated by the tester with a 1 picosecond resolution (1 strobe, 2 drive clocks, 1 retiming clock). A fan out IC may offer "native source sync" DQ/DQS. A raw delay may be provided just for "static de-skew" (path delay). A resolution of a "gate delay" of approximately 20 picoseconds may be possible. This device supports native clocking schemes, for example source synchronous, embedded clock or clock forwarding.

Referring to the diagram in FIG. 7, latencies tRDC, tCL have to be considered. The frequency may be 133 MHz, the burst length may be 8.

According to an exemplary embodiment, a Daisy chaining repeating structure to distribute Algorithmic Pattern Generator (APG) data is provided. Per-site, a comparison may be made of "expected data" and "DUT response data". Fan out and local retiming with tester clocks may be performed (which may be different per-site due to repeater delay) to keep fan out as "static delay".

Furthermore, a split of I/O and core access into different sequential test portions may be possible.

It should be noted that the term "comprising" does not exclude other elements or features and the "a" or "an" does not exclude a plurality. Also elements described in association with different embodiments may be combined. It should also be noted that reference signs in the claims shall not be construed as limiting the scope of the claims.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A signal processing device comprising:
 a plurality of processing stages, each of the plurality of processing stages being adapted for applying a test signal to each of at least one item under examination to be coupled to a respective one of the plurality of processing stages;
 a signal reconditioning unit adapted for reconditioning an input signal;
 wherein one of the plurality of processing stages comprises an input connectable to an input signal generation unit for receiving the input signal therefrom and wherein the one of the plurality of processing stages is adapted for supplying the input signal to the signal reconditioning unit, and
 wherein an input of a subsequent processing stage is connected to the signal reconditioning unit for receiving a reconditioned input signal therefrom.

2. The device of claim 1, wherein the processing stages are coupled to one another in such a manner that the input signal can be applied to at least two of the plurality of processing stages as a common input signal.

3. The device of claim 1, wherein the processing stages are coupled to one another in such a manner that a plurality of input signals can be applied to at least two of the plurality of processing stages as a common input signal.

4. The device of claim 1, wherein the input signal generation unit adapted for generating the input signal.

5. The device of claim 4, wherein the input signal generation unit is adapted for generating a plurality of input signals.

6. The device of claim 4, wherein the input signal generation unit is coupled to at least two of the plurality of processing stages via at least one common wire carrying the input signal to be supplied to the at least two of the plurality of processing stages.

7. The device of claim 1, wherein a signal path between a first one of the plurality of processing stages and the input signal generation unit is free of a signal reconditioning unit so that the input signal is applyable directly from the input signal generation unit to the first one of the plurality of processing stages.

8. The device of claim 1, wherein the input signal generation unit is adapted for generating the input signal as a stimulating signal for performing a test for testing the at least one item under examination coupled or to be coupled to at least one of the plurality of processing stages.

9. The device of claim 1, comprising, for at least two of the plurality of processing stages, the respective at least one item under examination.

10. The device of claim 9, wherein at least a part of the items under examination are devices under test.

11. The device of claim 1, wherein at least a part of the items under examination are memory devices under test.

12. The device of claim 1, wherein at least a part of the plurality of processing stages are coupled to one another as a Daisy chain.

13. The device of claim 1, wherein the signal reconditioning unit is a repeater unit.

14. The device of claim 1, wherein at least a part of the plurality of processing stages is adapted to receive, from each of the respectively assigned at least one item under examination, a plurality of response signals in response to the input signal applied to each of the respectively assigned at least one item under examination.

15. The device of claim 14, wherein at least a part of the plurality of processing stages is adapted to generate, based on the plurality of response signals of each of the respectively assigned at least one item under examination, a decreased number of response signals.

16. The device of claim 15, wherein the decreased number of response signals is indicative of a test result of testing the respectively assigned at least one item under examination.

17. The device of claim 15, wherein the decreased number of response signals is one.

18. The device of claim 1, wherein at least a part of the plurality of processing stages is adapted to fan out the input signal to at least two of the respectively assigned at least one item under examination.

19. The device of claim 1, comprising a timing signal generation unit adapted for generating a timing signal and adapted for supplying the timing signal to at least two of the plurality of processing stages for timing the signal processing of the at least two of the plurality of processing stages.

20. The device of claim 19, wherein at least two of the plurality of processing stages is adapted to fan out the timing signal to at least two of the respectively assigned at least one item under examination.

21. A measurement apparatus, the measurement apparatus comprising:
   an input signal generation unit adapted for generating an input signal related to a measurement carried out by the measurement apparatus;
   a signal processing device for processing the input signal and for generating an output signal indicative of a result of the measurement carried out based on the input signal, the signal processing device comprising:
      a plurality of processing stages, each of the plurality of processing stages being adapted for applying a test signal to each of at least one item under examination to be coupled to a respective one of the plurality of processing stages;
      a signal reconditioning unit adapted for reconditioning the input signal;
      wherein one of the plurality of processing stages comprises an input connectable to the input signal generation unit for receiving the input signal therefrom and wherein the one of the plurality of processing stages is adapted for supplying the input signal to the signal reconditioning unit, and
      wherein an input of a subsequent processing stage is connected to the signal reconditioning unit for receiving a reconditioned input signal therefrom.

22. The measurement apparatus of claim 21, comprising at least one of a test device for testing a device under test or a substance, a memory test device for testing a memory device under test or a substance, a device for chemical, biological and/or pharmaceutical analysis, a fluid separation system adapted for separating compounds of a fluid, a capillary electrophoresis device, a liquid chromatography device, a gas chromatography device, an electronic measurement device, and a mass spectroscopy device.

23. The measurement apparatus of claim 21,
   wherein the measurement apparatus comprises a first measurement unit adapted for performing a first part of a measurement;
   wherein the measurement apparatus comprises a second measurement unit adapted for performing a second part of the measurement;
   wherein at least a part of the measurement functionality of the first measurement unit is not included in the measurement functionality of the second measurement unit and/or wherein at least a part of the measurement functionality of the second measurement unit is not included in the measurement functionality of the first measurement unit.

24. The measurement apparatus of claim 23, wherein the first measurement unit is coupled to the second measurement unit to provide an automatic feed forward function.

* * * * *